(12) United States Patent
Chen et al.

(10) Patent No.: US 9,803,837 B2
(45) Date of Patent: Oct. 31, 2017

(54) WHITE-LIGHT LED MODULES

(71) Applicant: Shenzhen China Star Optoelectronics Technology Co., Ltd., Shenzhen, Guangdong (CN)

(72) Inventors: Lingyan Chen, Guangdong (CN); Yanxue Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 263 days.

(21) Appl. No.: 14/438,220

(22) PCT Filed: Jan. 28, 2015

(86) PCT No.: PCT/CN2015/071709
§ 371 (c)(1),
(2) Date: Apr. 23, 2015

(87) PCT Pub. No.: WO2016/106924
PCT Pub. Date: Jul. 7, 2016

(65) Prior Publication Data
US 2016/0341403 A1   Nov. 24, 2016

(30) Foreign Application Priority Data

Dec. 31, 2014 (CN) .......................... 2014 1 0855946

(51) Int. Cl.
*F21V 19/00* (2006.01)
*F21S 4/28* (2016.01)
(Continued)

(52) U.S. Cl.
CPC ............ *F21V 19/0025* (2013.01); *F21K 9/62* (2016.08); *F21S 4/28* (2016.01); *F21V 7/0016* (2013.01); *H01L 25/0753* (2013.01); *H01L 33/60* (2013.01); *H01L 33/62* (2013.01); *H05B 37/00* (2013.01); *F21Y 2105/16* (2016.08); *F21Y 2107/20* (2016.08); *F21Y 2113/13* (2016.08); *F21Y 2115/10* (2016.08)

(58) Field of Classification Search
None
See application file for complete search history.

(56) References Cited

U.S. PATENT DOCUMENTS 7,914,180 B2 * 3/2011 Lee ........................... F21V 7/09
                                                         362/296.01
8,450,748 B2 * 5/2013 Su ...................... H05B 33/0803
                                                              257/76
(Continued)

*Primary Examiner* — Kristy A Haupt
(74) *Attorney, Agent, or Firm* — Andrew C. Cheng

(57) ABSTRACT

A white-light LED module is disclosed. The white-light LED module includes a substrate, and a red-light LED chip string, a blue-light LED chip string, and a green-light LED chip string arranged on the substrate. The red-light LED chip string, the blue-light LED chip string, and the green-light LED chip string are connected in parallel. A number of blue LED chips within the blue-light LED chip string equals to the number of green LED chips within the green-light LED chip string. The number of red LED chips within the red-light LED chip string is as double as the number of blue LED chips and the green LED chips. In this way, the light mixture performance of the red, green and blue LED chips may be enhanced.

18 Claims, 2 Drawing Sheets

(51) Int. Cl.
*F21K 9/62* (2016.01)
*H01L 25/075* (2006.01)
*H01L 33/60* (2010.01)
*H01L 33/62* (2010.01)
*F21V 7/00* (2006.01)
*H05B 37/00* (2006.01)
*F21Y 105/16* (2016.01)
*F21Y 113/13* (2016.01)
*F21Y 115/10* (2016.01)
*F21Y 107/20* (2016.01)

(56) References Cited

U.S. PATENT DOCUMENTS

2007/0115662 A1* 5/2007 Roberts .............. G09G 3/3413
362/249.16
2010/0244061 A1* 9/2010 Shirakawa .............. F21K 9/00
257/89

* cited by examiner

WHITE-LIGHT LED MODULES

BACKGROUND OF THE INVENTION

1. Field of the Invention

The present disclosure relates to LED lighting technology, and more particularly to a white-light LED module.

2. Discussion of the Related Art

LED is an energy-saving light source developed to replace traditional light source. LEDs are characterized by attributes such as high efficiency, good optical performance, high color purity, appropriate voltage, low power consumption, long life cycle, and so on.

Generally, white light LEDs are manufactured by encapsulating blue chips and yellow YAG phosphors. However, such white light LEDs lack red and the colors shown are cold. In addition, the YAG phosphors may be affected by temperature so as to cause light wane. Thus, a new solution is to assemble the white light LED with RGB chips. As the RGB chips are of high brightness, and thus the white light may be formed by the triple color chips directly without the conversion of the phosphors. In this way, a better lighting efficiency may be obtained as the phosphor conversion is omitted. In addition, lighting density of the triple color chips may be independently controlled so as to obtain a full-color color conversion. Further, a better color rendering may be obtained by selecting the wavelength and the density of the LEDs. However, it is still difficult to perform the light mixture. As a result, users in front of the light source may observe light beams of different colors and colorful shadows behind shelter.

Thus, it is needed to provide a white-light LED module to solve the above-mentioned problems.

SUMMARY

According to the present disclosure, the white-light LED module may enhance the mixed light performance of the triple colors, including red, green, and blue, LED chip.

In one aspect, a white-light LED module includes: a substrate, and a red-light LED chip string, a blue-light LED chip string, and a green-light LED chip string arranged on the substrate, wherein the red-light LED chip string, the blue-light LED chip string, and the green-light LED chip string are connected in parallel, a number of blue LED chips within the blue-light LED chip string equals to the number of green LED chips within the green-light LED chip string, the number of red LED chips within the red-light LED chip string is as double as the number of blue LED chips and the green LED chips; two pins, two ends of the red-light LED chip string, of the blue-light LED chip string, and of the green-light LED chip string respectively connect to one corresponding pin; at least one reflective wall surrounding the red-light LED chip string, the blue-light LED chip string, and the green-light LED chip string, wherein the substrate comprises a curved surface such that at least a portion of light beams emitted from the red LED chips, the blue LED chip, and the green LED chip are reflected back by the reflective wall.

Wherein the red-light LED chip string comprises two red LED chips, the blue-light LED chip string comprises one blue LED chip, and the green-light LED chip string comprises one green LED chip, the two red LED chips are serially connected, and the serially connected red LED chips further connect with the blue LED chip and the green LED chip in parallel.

Wherein the substrate is circular-shaped, the circle is divided into four sectors, and the two red LED chips, the blue LED chip, and the green LED chip are respectively arranged corresponding to one sector.

Wherein the red LED chips are respectively arranged in two sectors that are not adjacent to each other.

Wherein angles respectively formed by connecting lines between the red LED chips, the blue LED chip, the green LED chip and a center are substantially the same.

Wherein the substrate protrudes from edges of the substrate toward a center of the substrate along a light-emitting direction of the white-light LED module.

Wherein an internal surface of the reflective wall is arranged with a convex-concave reflective structure.

Wherein the red LED chips operate when the voltage is within a range of 1.8 and 2.6V, and the blue LED chips and the green LED chips operate when the voltage is within a range of 2.8 and 3.6V.

In another aspect, a white-light LED module includes: a substrate, and a red-light LED chip string, a blue-light LED chip string, and a green-light LED chip string arranged on the substrate, wherein the red-light LED chip string, the blue-light LED chip string, and the green-light LED chip string are connected in parallel, a number of blue LED chips within the blue-light LED chip string equals to the number of green LED chips within the green-light LED chip string, the number of red LED chips within the red-light LED chip string is as double as the number of blue LED chips and the green LED chips.

Wherein the module further comprises two pins, two ends of the red-light LED chip string, of the blue-light LED chip string, and of the green-light LED chip string respectively connect to one corresponding pin.

Wherein the red-light LED chip string comprises two red LED chips, the blue-light LED chip string comprises one blue LED chip, and the green-light LED chip string comprises one green LED chip, the two red LED chips are serially connected, and the serially connected red LED chips further connect with the blue LED chip and the green LED chip in parallel.

Wherein the substrate is circular-shaped, the circle is divided into four sectors, and the two red LED chips, the blue LED chip, and the green LED chip are respectively arranged corresponding to one sector.

Wherein the red LED chips are respectively arranged in two sectors that are not adjacent to each other.

Wherein angles respectively formed by connecting lines between the red LED chips, the blue LED chip, the green LED chip and a center are substantially the same.

Wherein the white-light LED module further comprises at least one reflective wall surrounding the red-light LED chip string, the blue-light LED chip string, and the green-light LED chip string, wherein the substrate comprises a curved surface such that at least a portion of light beams emitted from the red LED chips, the blue LED chip, and the green LED chip are reflected back by the reflective wall.

Wherein the substrate protrudes from edges of the substrate toward a center of the substrate along a light-emitting direction of the white-light LED module.

Wherein an internal surface of the reflective wall is arranged with a convex-concave reflective structure.

Wherein the red LED chips operate when the voltage is within a range of 1.8 and 2.6V, and the blue LED chips and the green LED chips operate when the voltage is within a range of 2.8 and 3.6V.

In view of the above, the white-light LED module includes a substrate, and red, blue, green LED chip string being arranged on the substrate and being connected in parallel. The number of the blue LED chips within the blue-light LED chip string equals to the number of the green LED chips within the green-light LED chip string. In addition, the number of the red LED chips within the red-light LED chip string is as double as the number of the blue LED chips and the green LED chips. In this way, the pins for connecting outward may be decreased so as to contribute to the mixture of the light beams.

DETAILED DESCRIPTION OF THE EMBODIMENTS

Embodiments of the invention will now be described more fully hereinafter with reference to the accompanying drawings, in which embodiments of the invention are shown.

Figure 1:
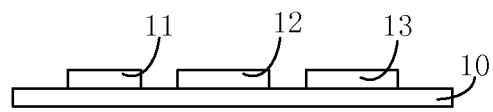
FIG. 1 is a schematic view of the white-light LED module in accordance with a first embodiment.
Figure 2:
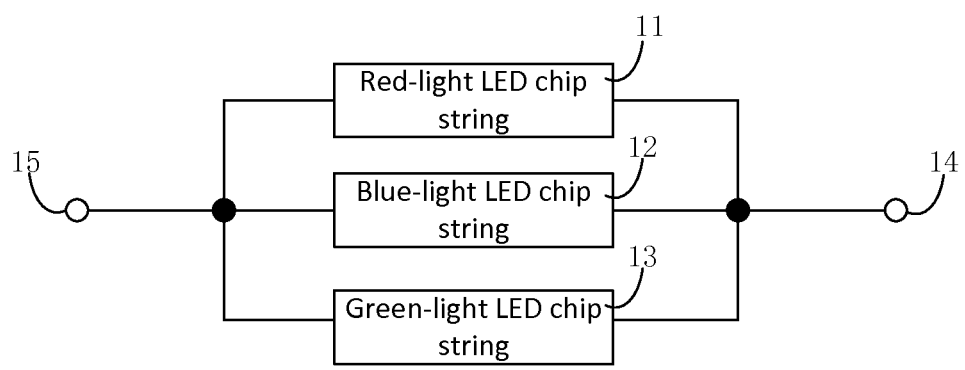
FIG. 2 is a circuit diagram of the white-light LED module in accordance with the first embodiment.

FIG. 1 is a schematic view of the white-light LED module in accordance with a first embodiment. FIG. 2 is a circuit diagram of the white-light LED module in accordance with the first embodiment. In the embodiment, the white-light LED module includes a substrate 10, a red-light LED chip string 11, a blue-light LED chip string 12, and a green-light LED chip string 13. The red-light LED chip string 11, the blue-light LED chip string 12, and the green-light LED chip string 13 are connected in parallel and are arranged on the substrate 10. The number of the blue LED chips within the blue-light LED chip string 12 equals to the number of the green LED chips within the green-light LED chip string 13. In addition, the number of the red LED chips within the red-light LED chip string 11 is as double as the number of the blue LED chips and the green LED chips.

In an example, the white-light LED module further includes two pins 14, 15, two ends of the red-light LED chip string 11, of the blue-light LED chip string 12, and of the green-light LED chip string 13 respectively corresponds to one pin 14, 15.

Figure 3:
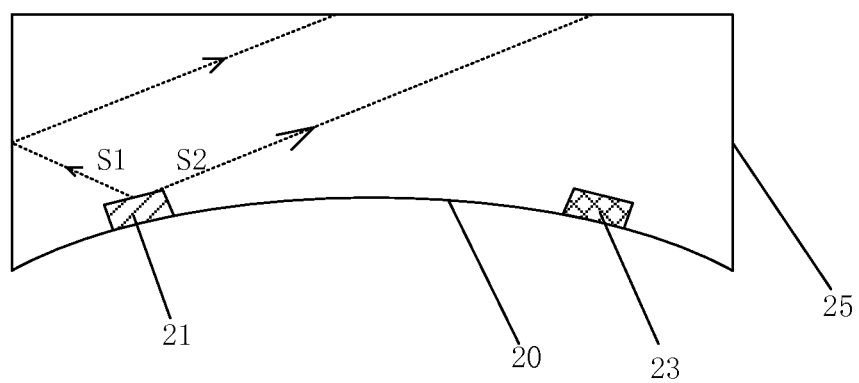
FIG. 3 is a cross sectional view of the white-light LED module in accordance with a second embodiment.
Figure 4:
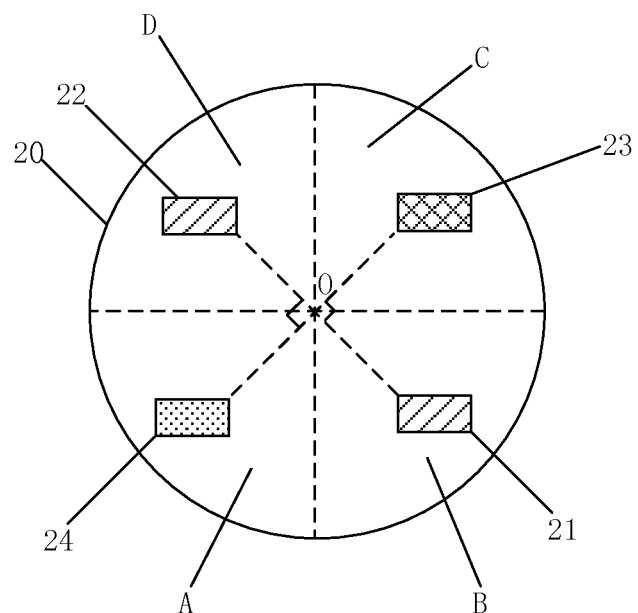
FIG. 4 is a top view of the white-light LED module in accordance with the second embodiment.
Figure 5:
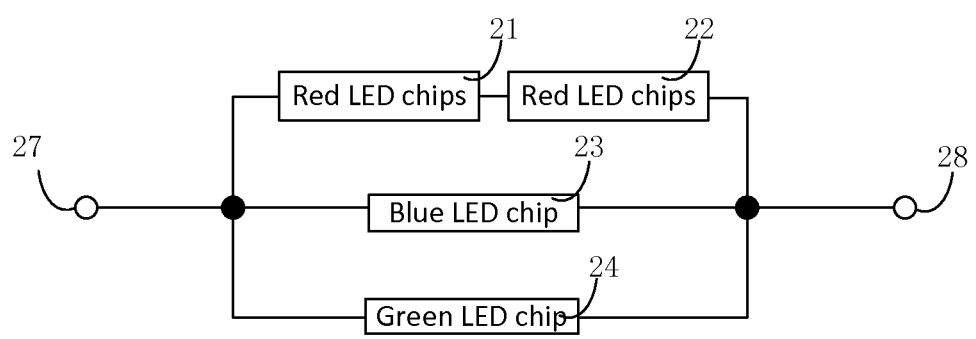
FIG. 5 is a circuit diagram of the white-light LED module in accordance with the second embodiment.

FIG. 3 is a cross sectional view of the white-light LED module in accordance with a second embodiment. FIG. 4 is a top view of the white-light LED module in accordance with the second embodiment. FIG. 5 is a circuit diagram of the white-light LED module in accordance with the second embodiment.

In the embodiment, the white-light LED module includes a substrate 20, a red-light LED chip string, a blue-light LED chip string, and a green-light LED chip string. The red-light LED chip string, the blue-light LED chip string, and the green-light LED chip string are connected in parallel and are arranged on the substrate 20. The red-light LED chip string includes two red LED chips 21, 22. The blue-light LED chip string includes one blue LED chip 23. The green-light LED chip string includes one green LED chip 24. The two red LED chips 21 are serially connected. In addition, the serially connected red LED chips 21, 22 further connect with the blue LED chip 23 and the green LED chip 24 in parallel. The two red LED chips 21, 22 are serially connected, and then are connected with the blue LED chip 23 and the green LED chip 24 in parallel. Afterward, two ends of the above circuit configuration respectively connect to the pins 27, 28.

In the embodiment, the substrate 20 is circular-shaped. In an example, the shape of the substrate 20 is circle in a top view. The circle is divided to four sectors A, B, C, D from the center of the circle. The two red LED chips 21, 22, the blue LED chip 23, and the green LED chip 24 are respectively arranged to be corresponding to one sector. The red LED chip 21 is arranged in the sector B, the red LED chip 22 is arranged in the sector D, the blue LED chip 23 is arranged in the sector C, and the green LED chip 24 is arranged in the sector A.

In an example, the red LED chips 21, 22 are respectively arranged in two sectors B, D that are not adjacent to each other.

In an example, the angles respectively formed by connecting lines between the red LED chips 21, 22, the blue LED chip 23, the green LED chip 24 and a center (O) are substantially the same. The angels between two adjacent lines are substantially around 90 degrees.

In an example, the white-light LED module further includes at least one reflective wall 25 surrounding the red-light LED chip string, the blue-light LED chip string, and the green-light LED chip string. The substrate 20 includes a curved surface such that at least a portion of light beams emitted from the red LED chips 21, 22, the blue LED chip 23, and the green LED chip 24 are reflected back by the reflective wall 25. For instance, among the light beams S1, S2, only light beam S1 emits out from a light emitting surface after being reflected by the reflective wall 25. The light beam S2 directly emits out from the light emitting surface.

In an example, the substrate 20 protrudes from edges of the substrate 20 toward a center of the substrate 20 along a light-emitting direction (A) of the white-light LED module.

In an example, an internal surface of the reflective wall 25 is arranged with a convex-concave reflective structure 30. The internal surface is not a smooth reflective surface. In other embodiments, the internal surface of the reflective wall 25 may be a smooth reflective surface. It can be understood that as the substrate 20 includes the curved surface, the light beams may be emitted out in a distributed manner. In addition, the convex-concave reflective structure 30 of the internal surface of the reflective wall 25 may contribute to the mixture of the light beams.

In an example, the red LED chips 21, 22 may operate when the voltage is within a range of 1.8 and 2.6V. The blue LED chips 23 and the green LED chips 24 may operate when the voltage is within a range of 2.8 and 3.6V.

In view of the above, the white-light LED module includes a substrate, and red, blue, green LED chip string being arranged on the substrate and being connected in parallel. The number of the blue LED chips within the blue-light LED chip string equals to the number of the green LED chips within the green-light LED chip string. In addition, the number of the red LED chips within the red-light LED chip string is as double as the number of the blue LED chips and the green LED chips. In this way, the pins for connecting outward may be decreased so as to contribute to the mixture of the light beams.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A white-light LED module, comprising:
a substrate, and a red-light LED chip string, a blue-light LED chip string, and a green-light LED chip string arranged on the substrate, wherein the red-light LED chip string, the blue-light LED chip string, and the green-light LED chip string are connected in parallel, a number of blue LED chips within the blue-light LED chip string equals to the number of green LED chips within the green-light LED chip string, the number of red LED chips within the red-light LED chip string is as double as the number of blue LED chips and the green LED chips;
two pins, two ends of the red-light LED chip string, of the blue-light LED chip string, and of the green-light LED chip string respectively connect to one corresponding pin;
at least one reflective wall surrounding the red-light LED chip string, the blue-light LED chip string, and the green-light LED chip string, wherein the substrate comprises a curved surface such that at least a portion of light beams emitted from the red LED chips, the blue LED chip, and the green LED chip are reflected back by the reflective wall.

2. The white-light LED module as claimed in claim 1, wherein the red-light LED chip string comprises two red LED chips, the blue-light LED chip string comprises one blue LED chip, and the green-light LED chip string comprises one green LED chip, the two red LED chips are serially connected, and the serially connected red LED chips further connect with the blue LED chip and the green LED chip in parallel.

3. The white-light LED module as claimed in claim 2, wherein the substrate is circular-shaped, the circle is divided into four sectors, and the two red LED chips, the blue LED chip, and the green LED chip are respectively arranged corresponding to one sector.

4. The white-light LED module as claimed in claim 3, wherein the red LED chips are respectively arranged in two sectors that are not adjacent to each other.

5. The LED module as claimed in claim 3, wherein angles respectively formed by connecting lines between the red LED chips, the blue LED chip, the green LED chip and a center are substantially the same.

6. The white-light LED module as claimed in claim 1, wherein the substrate protrudes from edges of the substrate toward a center of the substrate along a light-emitting direction of the white-light LED module.

7. The white-light LED module as claimed in claim 1, wherein an internal surface of the reflective wall is arranged with a convex-concave reflective structure.

8. The white-light LED module as claimed in claim 1, wherein the red LED chips operate when the voltage is within a range of 1.8 and 2.6V, and the blue LED chips and the green LED chips operate when the voltage is within a range of 2.8 and 3.6V.

9. A white-light LED module, comprising:
a substrate, and a red-light LED chip string, a blue-light LED chip string, and a green-light LED chip string arranged on the substrate, wherein the red-light LED chip string, the blue-light LED chip string, and the green-light LED chip string are connected in parallel, a number of blue LED chips within the blue-light LED chip string equals to the number of green LED chips within the green-light LED chip string, the number of red LED chips within the red-light LED chip string is as double as the number of blue LED chips and the green LED chips.

10. The white-light LED module as claimed in claim 9, wherein the module further comprises two pins, two ends of the red-light LED chip string, of the blue-light LED chip string, and of the green-light LED chip string respectively connect to one corresponding pin.

11. The white-light LED module as claimed in claim 9, wherein the red-light LED chip string comprises two red LED chips, the blue-light LED chip string comprises one blue LED chip, and the green-light LED chip string comprises one green LED chip, the two red LED chips are serially connected, and the serially connected red LED chips further connect with the blue LED chip and the green LED chip in parallel.

12. The white-light LED module as claimed in claim 11, wherein the substrate is circular-shaped, the circle is divided into four sectors, and the two red LED chips, the blue LED chip, and the green LED chip are respectively arranged corresponding to one sector.

13. The white-light LED module as claimed in claim 12, wherein the red LED chips are respectively arranged in two sectors that are not adjacent to each other.

14. The white-light LED module as claimed in claim 12, wherein angles respectively formed by connecting lines between the red LED chips, the blue LED chip, the green LED chip and a center are substantially the same.

15. The white-light LED module as claimed in claim 9, wherein the white-light LED module further comprises at least one reflective wall surrounding the red-light LED chip string, the blue-light LED chip string, and the green-light LED chip string, wherein the substrate comprises a curved surface such that at least a portion of light beams emitted from the red LED chips, the blue LED chip, and the green LED chip are reflected back by the reflective wall.

16. The white-light LED module as claimed in claim 15, wherein the substrate protrudes from edges of the substrate toward a center of the substrate along a light-emitting direction of the white-light LED module.

17. The white-light LED module as claimed in claim 15, wherein an internal surface of the reflective wall is arranged with a convex-concave reflective structure.

18. The white-light LED module as claimed in claim 9, wherein the red LED chips operate when the voltage is within a range of 1.8 and 2.6V, and the blue LED chips and the green LED chips operate when the voltage is within a range of 2.8 and 3.6V.

* * * * *